United States Patent [19]
Gamo

[11] Patent Number: 6,002,308
[45] Date of Patent: Dec. 14, 1999

[54] PIEZOELECTRIC FILTER WITH A CAPACITOR ON A SUBSTRATE HAVING AN UNPOLARIZED PORTION

[75] Inventor: Masao Gamo, Takaoka, Japan

[73] Assignee: Murata Manufacturing Co., Ltd., Kyoto, Japan

[21] Appl. No.: 09/050,547

[22] Filed: Mar. 30, 1998

[30] Foreign Application Priority Data

Apr. 1, 1997 [JP] Japan ................................ 9-083006

[51] Int. Cl.⁶ .............................. H03H 9/54; H03H 9/60
[52] U.S. Cl. ...................... 333/187; 333/189; 310/349; 310/366
[58] Field of Search .................................. 333/187–192; 310/340, 349, 348, 321, 351–353, 365–368

[56] References Cited

U.S. PATENT DOCUMENTS

| | | | |
|---|---|---|---|
| 3,624,431 | 11/1971 | Machida et al. ..................... | 333/186 X |
| 3,676,724 | 7/1972 | Berlincourt et al. ................. | 333/187 X |
| 5,406,230 | 4/1995 | Yamamoto ........................... | 310/366 X |

FOREIGN PATENT DOCUMENTS

| | | | |
|---|---|---|---|
| 26 20 288 A1 | 11/1976 | Germany ............................... | 333/191 |
| 57-72412 | 5/1982 | Japan ................................. | 333/187 F |
| 57-157614 | 9/1982 | Japan . | |
| 59-159026 | 10/1984 | Japan . | |
| 59-164329 | 11/1984 | Japan . | |
| 62-112405 | 5/1987 | Japan . | |
| 63-92114 | 4/1988 | Japan ................................. | 333/191 |
| 05-67943 | 3/1993 | Japan ................................. | 333/190 |
| 05-259805 | 10/1993 | Japan ............................... | 333/187 R |
| 06-343014 | 12/1994 | Japan ................................. | 333/191 |
| 08-186459 | 7/1996 | Japan ................................. | 333/191 |

*Primary Examiner*—Robert Pascal
*Assistant Examiner*—Barbara Summons
*Attorney, Agent, or Firm*—Graham & James LLP

[57] ABSTRACT

A piezoelectric filter is arranged to suppress unnecessary vibrations caused by wiring patterns such as lead-out electrodes to improve filter characteristics. The filter includes a filter section having a pair of resonant electrodes located on an upper surface of a piezoelectric substrate, and a common electrode located on the lower surface of the substrate so as to be opposite to the resonant electrodes. A capacitor connected to the filter section includes a capacitive electrode having the function of a lead-out electrode and located on the upper surface of the piezoelectric substrate, and another capacitive electrode located on the lower surface of the piezoelectric substrate. Lead-out electrodes extend to edges of the piezoelectric substrate. The piezoelectric substrate is unpolarized in a region where at least a portion of the lead-out electrodes is located and in a vicinity of this region.

17 Claims, 7 Drawing Sheets

PIEZOELECTRIC FILTER WITH A CAPACITOR ON A SUBSTRATE HAVING AN UNPOLARIZED PORTION

BACKGROUND OF THE INVENTION

1. Field of the Invention

The present invention relates to an energy-trap type piezoelectric filter and, more particularly, to a piezoelectric filter having improved characteristics resulting from an improved polarized structure of a piezoelectric substrate.

2. Description of the Related Art

Piezoelectric filters are widely used as intermediate frequency stage band filters in mobile communication devices such as FM receivers and portable telephones. FIGS. 7A and 7B show a piezoelectric filter 51 as an example of this kind of filter.

The piezoelectric filter 51 includes a piezoelectric ceramic substrate 52 in the form of a rectangular plate. The entire area of the piezoelectric ceramic substrate 52 other than the area within the broken line A is polarized in the direction of thickness.

Energy-trap type filter sections 53 and 54 and a capacitor 55 are arranged on the piezoelectric ceramic substrate 52. The filter section 53 is constructed by disposing resonant electrodes 53a and 53b on the upper surface of the piezoelectric substrate 52 and by providing a common electrode 53c on the lower surface of the piezoelectric substrate 52. The resonant electrodes 53a and 53b on the upper surface of the piezoelectric substrate 52 are opposed to each other with a predetermined gap provided therebetween. Also, the resonant electrodes 53a and 53b and the common electrode 53c are disposed opposite to each other on opposite surfaces of the piezoelectric substrate 52.

The filter section 54 is constructed in the same manner as the filter section 53, and has resonant electrodes 54a and 54b and a common electrode 54c.

To form a capacitor 55, a capacitive electrode 55a is arranged on the upper surface of the central unpolarized region of the piezoelectric substrate 52 indicated by the broken line A, and a capacitive electrode 55b is provided on the lower surface of the unpolarized region. The capacitive electrodes 55a and 55b are disposed opposite to each other on opposite surfaces of the piezoelectric substrate 52.

A lead-out electrode 56 is arranged on the upper surface of the piezoelectric substrate 52 along one end surface 52a thereof. The lead-out electrode 56 is electrically connected to the resonant electrode 53a. The resonant electrode 53b is electrically connected to the capacitive electrode 55a. The capacitive electrode 55a is connected to the resonant electrode 54b. The resonant electrode 54a is connected to a lead-out electrode 57, which is arranged on the upper surface of the piezoelectric substrate 52 along another end surface 52b thereof.

On the lower surface of the piezoelectric substrate 52, the capacitive electrode 55b is connected to the common electrodes 53c and 54c.

Therefore, the piezoelectric filter 51 can be operated as a dual mode piezoelectric filter having the circuit shown in FIG. 8 by using the lead-out electrodes 56 and 57 as input and output electrodes and by connecting the capacitive electrodes 55b and the common electrodes 53c and 54c disposed on the lower surface of the piezoelectric substrate 52 to a ground potential point.

The unpolarized area of the piezoelectric substrate 52 indicated by broken line A, consisting of the portion on which the capacitive electrodes 55a and 55b are formed and a vicinity of the same, is left unpolarized in order to set tan δ of the capacitor 55 to a small value.

In the piezoelectric filter 51, polarization of the portions of the piezoelectric substrate 52 constituting the filter sections 53 and 54 and other adjacent portions is necessary for excitation of the piezoelectric substrate 52 and for smooth attenuation of vibration at the filter sections 53 and 54. On the other hand, it is desirable to leave the portion constituting the capacitor 55 unpolarized so that tan δ of the capacitor 55 can be small, as mentioned above.

In the piezoelectric filter 51, however, the portions of the piezoelectric substrates on which the lead-out electrodes 56 and 57 are provided are also polarized and as a result, it is possible, depending upon the electrode layout, that undesirable and unnecessary vibration will result in a deterioration in filter characteristic.

Therefore, it is also desirable to leave the portion of the piezoelectric ceramic substrate 52 where the lead-out electrodes 56 and 57 are located unpolarized. If so, the unpolarized portion must be located in a region where the vibration by the filter sections 53 and 54 does not reach. Thus, the unpolarized portion can not be extended near to the portion of the piezoelectric ceramic substrate 52 where the filter sections 53 and 54 are located.

SUMMARY OF THE INVENTION

To overcome the problems described above, the preferred embodiments of the present invention provide a piezoelectric filter in which unnecessary vibration due to electrode patterns on the piezoelectric substrate is significantly reduced and which achieves improved filter characteristics.

In addition, the preferred embodiments of the present invention provide a piezoelectric filter which has a structure which allows a portion of a dielectric substrate constituting capacitive electrodes and lead-out electrodes to be left unpolarized.

To achieve the above-described features, benefits and advantages, a preferred embodiment of the present invention provides an energy-trap type piezoelectric filter comprising a piezoelectric substrate having first and second major surfaces, first and second resonant electrodes provided on the first major surface and spaced from each other by a gap therebetween, a common electrode provided on the second major surface and located opposite to the first and second resonant electrodes, an excitation section including the first and second resonant electrodes, the common electrode, and a portion of the piezoelectric substrate located between the first and second resonant electrodes and the common electrode, a plurality of lead-out electrodes provided on the first and second major surfaces and connected to one of the first and second resonant electrodes and the common electrode respectively, and first and second capacitive electrodes defining a capacitor and provided on the piezoelectric substrate and electrically connected to the excitation section, wherein the excitation section is located at a substantially central portion of the substrate, the first and second capacitive electrodes are located in a vicinity of a first edge of the piezoelectric substrate, a plurality of lead-out electrodes are located in the vicinity of a second edge of the piezoelectric substrate so as to extend to the second edge, the portion of the piezoelectric substrate constituting the excitation section is polarized, and another portion of the piezoelectric substrate where at least one of the plurality of lead-out electrodes and the first and second capacitive electrodes are located is unpolarized.

The above novel structure and arrangement of the filter elements effectively suppresses and eliminates unnecessary vibration caused by the lead-out electrode and the capacitor.

In the above-described piezoelectric filter, the unpolarized portion of the piezoelectric ceramic substrate preferably extends parallel to the direction of connection between the first and second resonant electrodes.

In an energy-trap type piezoelectric filter, it is necessary that vibration propagates largely in the direction of connection between the first and second resonant electrodes and is smoothly attenuated at the opposite ends in the resonant electrode opposition direction of the portion of the piezoelectric substrate on which the resonant electrodes are disposed. It is therefore necessary to maintain certain piezoelectricity in the region extending parallel to the direction of connection between the first and second resonant electrodes. On the other hand, it is desirable that the regions located outside of the region extending parallel to the direction of connection between the first and second resonant electrodes are unpolarized.

According to preferred embodiments of the present invention, therefore, the piezoelectric substrate is left unpolarized at locations of the lead-out electrodes disposed outside the region which extends parallel to the direction of connection between the first and second resonant electrodes and in the vicinity of the lead-out electrodes. In this manner, unnecessary vibration caused by the lead-out electrodes can be suppressed without any considerable deterioration in the characteristics of the section of the filter having the first and second resonant electrodes.

In the above-described piezoelectric filter, the first and second capacitive electrodes are preferably arranged such that they are opposed to each other with the piezoelectric substrate located therebetween.

If the corresponding portion of the piezoelectric substrate is polarized, large unnecessary vibration occurs therein. According to the preferred embodiments of the present invention, however, the capacitor forming portion is left unpolarized to effectively suppress such unnecessary vibration.

In the above energy-trap type piezoelectric filter, at least two of the piezoelectric substrates may be stacked on top of each other such that the second major surface of one of the piezoelectric substrates faces the first major surface of the adjacent one of the piezoelectric substrates.

With such a unique structure and arrangement, the compact piezoelectric filter having at least two of the piezoelectric substrates is achieved.

In the above-described energy-trap type piezoelectric filter, at least two of the piezoelectric substrates may be bonded to each other by adhesive or other bonding material or device, wherein the adhesive is not applied to the portions of the piezoelectric substrates corresponding to the excitation section. An adhesive sheet having an opening located at an area corresponding to the excitation section can also be used.

The preferred embodiments of the present invention are especially applicable to piezoelectric filters in which the wiring layout tends to be complicated, e.g., a piezoelectric filter having a plurality of filter sections arranged on one piezoelectric substrate, and a piezoelectric filter constructed by superposing a plurality of piezoelectric substrates having filter sections. In such cases, unnecessary vibrations due to wiring patterns including lead-out electrodes are effectively suppressed. The preferred embodiments of the present invention can advantageously be applied to piezoelectric filters having such complicated structures as those mentioned above to effectively improve characteristics of the piezoelectric filers having a complicated wiring layout.

The above-described and additional advantages, features and benefits will become more apparent by the drawings illustrating preferred embodiments of the present invention and related description of the preferred embodiments of the present invention.

DETAILED DESCRIPTION OF PREFERRED EMBODIMENTS

Piezoelectric filters which represent nonrestrictive preferred embodiments of the present invention will be described with reference to the accompanying drawings.

Figure 1:
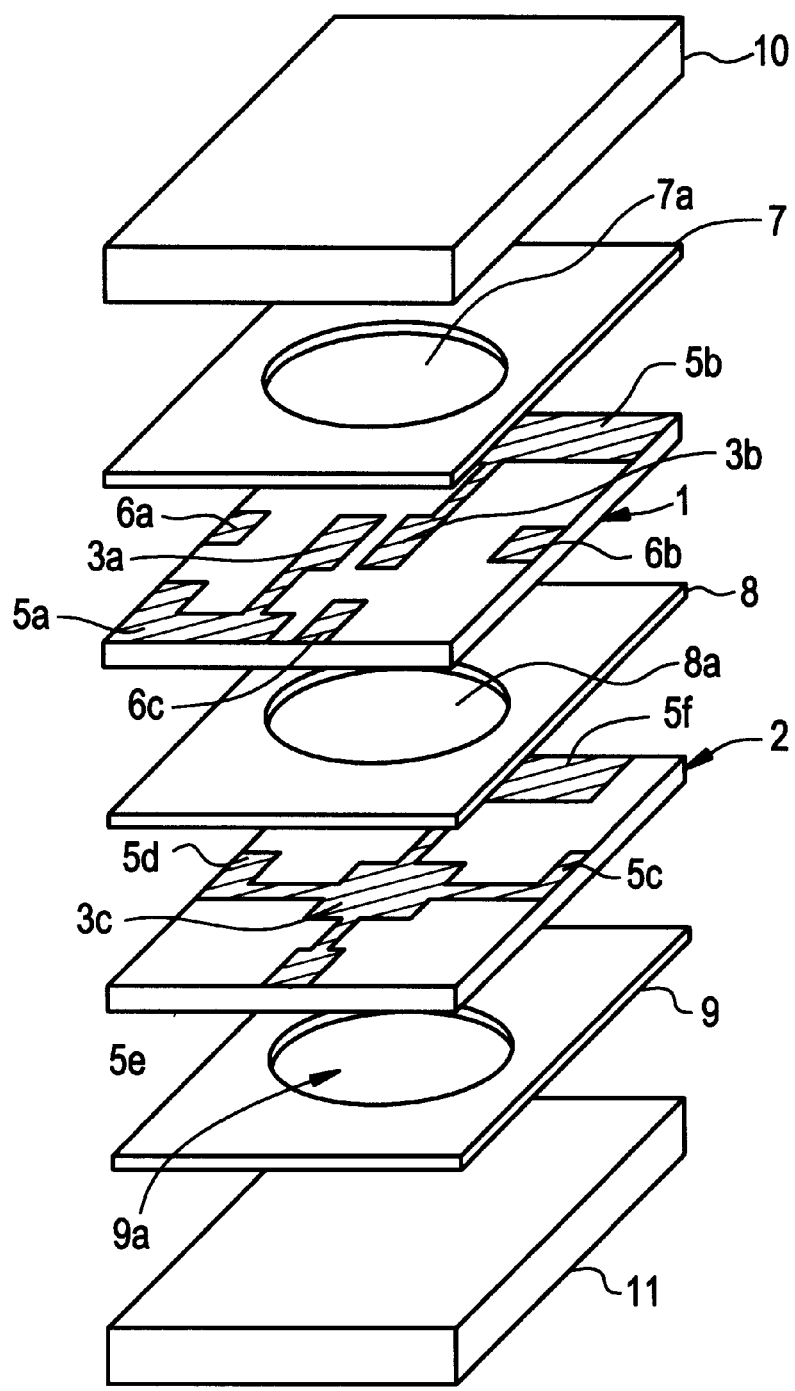
FIG. 1 is an exploded perspective view of a chip type piezoelectric filter according to a preferred embodiment of the present invention.

Referring to FIG. 1, a chip type piezoelectric filter in accordance with a preferred embodiment of the present invention is constructed by using first and second substantially rectangular piezoelectric substrates 1 and 2. Each of the first and second piezoelectric substrates 1 and 2 is preferably made of a piezoelectric ceramic material such as lead titanate-zirconate ceramic and each is polarized in the direction of thickness in such a manner as to include an unpolarized portion, as described above.

A first energy-trap type filter section using a thickness-direction longitudinal vibration mode is arranged on the first piezoelectric substrate 1. A second energy-trap type filter section using a thickness-direction longitudinal vibration mode is provided on the second piezoelectric substrate 2. A capacitor which functions as a relay capacitor is located on each of the first and second piezoelectric substrates 1 and 2.

Figure 2:
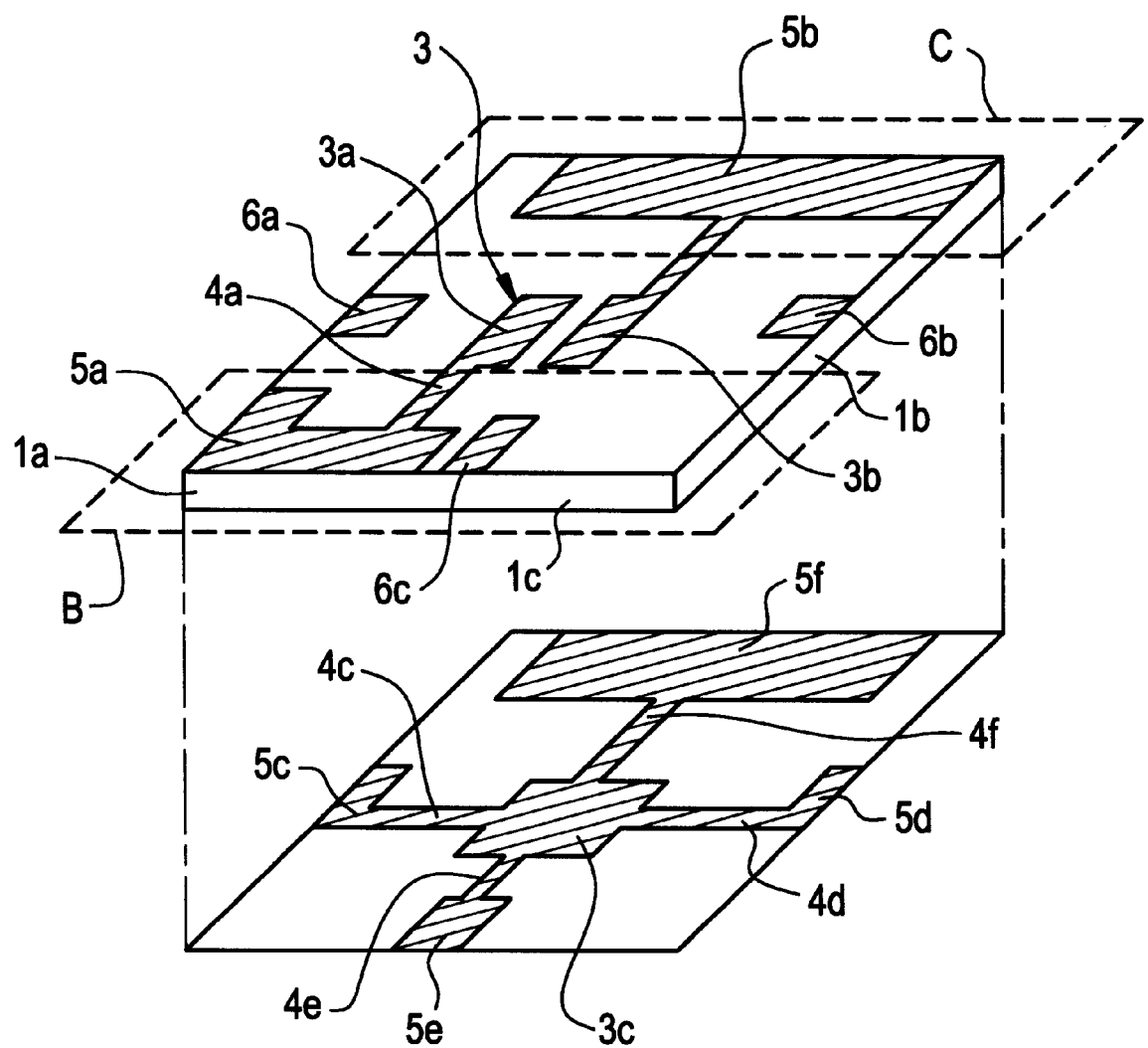
FIG. 2 is a schematic perspective view of the electrode structure and arrangement provided on the piezoelectric substrate used in the piezoelectric filter shown in FIG. 1.

The electrode structure and the polarized structure of the first piezoelectric substrate will be described with reference to FIG. 2. In FIG. 2, electrodes on the lower surface are shown by being projected onto a plane below.

A pair of resonant electrodes 3a and 3b are disposed at a substantially central region of the upper surface of the piezoelectric substrate 1 by being opposed to each other with a certain gap located therebetween. A common electrode 3c is provided on the lower surface of the piezoelectric substrate 1 opposite to the resonant electrodes 3a and 3b. The resonant electrodes 3a and 3b and the common electrodes 3c define the first filter section designated by reference numeral 3.

The resonant electrode 3a is connected to a lead-out electrode 5a by a connective conductor element 4a. The lead-out electrode 5a extends along one end surface 1a of the piezoelectric substrate 1.

The resonant electrode 3b is connected to a capacitive electrode 5b by a connective conductor element. The capacitive electrode 5b also functions as a lead-out electrode.

On the lower surface of the piezoelectric substrate 1, the common electrode 3c is connected to lead-out electrodes 5c, 5d, and 5e by connective conductor elements 4c, 4d and, 4e. The lead-out electrodes 5c and 5d extend to and along end surfaces 1a and 1b of the piezoelectric substrate 1, respectively. The lead-out electrode 5e extends to and along a side surface 1c of the piezoelectric substrate 1. The common electrode 3c is connected to a capacitive electrode 5f by a connective conductor element 4f. The capacitive electrode 5f is disposed on a side of the piezoelectric substrate 1 which is opposite to the side where the capacitive electrode 5b is located and the electrodes 5b and 5f are arranged such that the piezoelectric ceramic substrate 1 is located therebetween.

On the upper surface of the piezoelectric substrate 1, electrodes 6a, 6b, and 6c are located in the vicinity of central portions of the end surfaces 1a and 1b and the side surface 1c. Each of the electrodes 6a to 6c is located at a position so as to overlap the corresponding one of the lead-out electrodes 5c to 5e provided on the lower surface of the piezoelectric substrate 1, as viewed in the direction of thickness of the substrate. Each of the electrodes 6a to 6c is finally connected electrically to the corresponding one of the lead-out electrodes 5c to 5e.

Figure 3A:
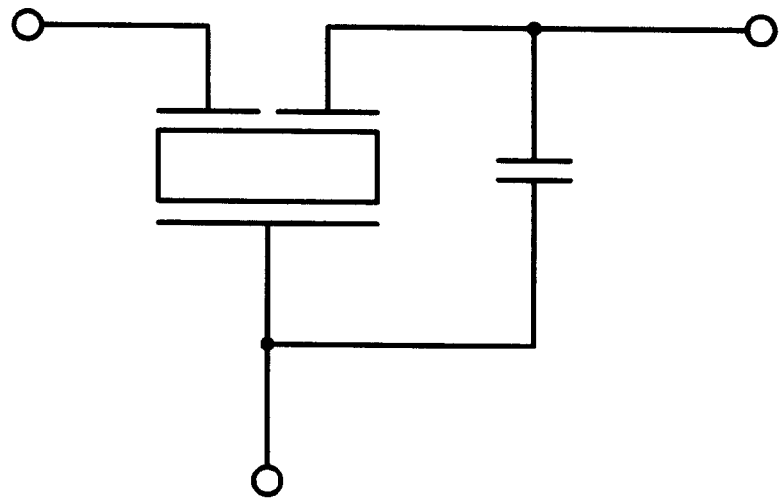
FIG. 3A is a circuit diagram illustrating a circuit provided on the first piezoelectric substrate.

FIG. 3A shows the circuit configuration on the above-described piezoelectric substrate. As is apparent from FIG. 3A, a circuit has a first filter section defined by the resonant electrodes 3a and 3b and the common electrode 3c, connected to a capacitor defined by the capacitive electrodes 5b and 5f.

Figure 3B:
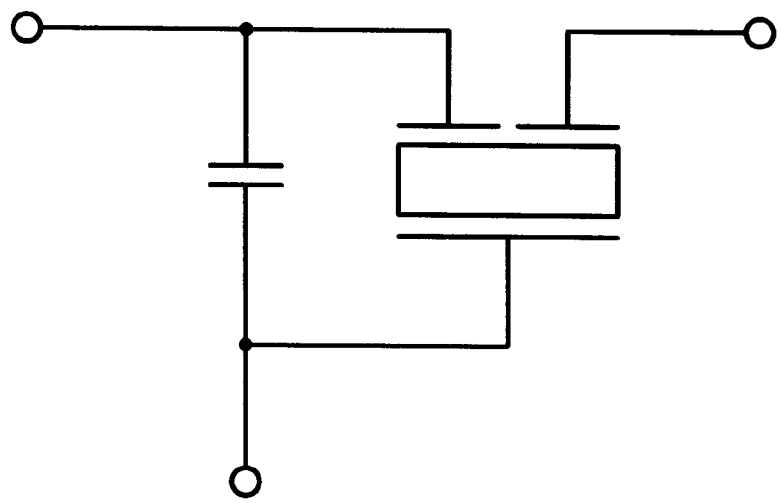
FIG. 3B is a circuit diagram illustrating a circuit provided on the second piezoelectric substrate.

Referring to FIG. 1, electrodes are preferably arranged on the piezoelectric substrate 2 in the same manner as those on the piezoelectric substrate 1 except that the electrodes on the two substrates are arranged in an inverted relationship with each other. Accordingly, on the piezoelectric substrate 2, a circuit in which a filter section and a relay capacitor section are connected as shown in FIG. 3B is provided.

The electrodes on the second piezoelectric substrate 2 corresponding to those on the first piezoelectric substrate 1 are indicated by the same reference characters in FIG. 1, and the description of these electrodes will not be repeated.

On the piezoelectric substrate 1, regions indicated by broken lines B and C are unpolarized and the remaining regions are polarized in the direction of thickness, as shown in FIG. 2. That is, the portions of the piezoelectric substrate 1 on which the lead-out electrodes 5a and 5e, the capacitive electrodes 5b and 5f and the electrode 6c are located are unpolarized. Therefore, when the filter section and the capacitor arranged on the piezoelectric substrate 1 are activated, vibration in a thickness-direction longitudinal vibration mode is excited and confined in the filter section 3 while unnecessary vibrations caused by lead-out electrodes 5a and 5e and the capacitive electrodes 5b and 5f provided on the unpolarized regions are effectively suppressed, thereby significantly improving filter characteristics. The effect of providing the above-described unpolarized regions will be described below on the basis of the result of an example of a preferred embodiment of the present invention.

Referring to FIG. 1, in the chip type piezoelectric filter of this preferred embodiment, the first and second piezoelectric substrates are superposed on each other in the direction of thickness and bonded to each other by an adhesive 8. An external substrate 10 is superposed on and bonded to the upper surface of the piezoelectric substrate 1 by adhesive 7. Similarly, an external substrate 11 is superposed on and bonded to the lower surface of the piezoelectric substrate 2 by adhesive 9.

Adhesives 7 to 9 are preferably not applied to the portions of the first and second piezoelectric substrates or the external substrates corresponding to the first and second filter sections located on the first and second piezoelectric substrates 1 because spaces for preventing hindrance of vibration of the first and second filter sections must be defined therebetween. In FIG. 1, therefore, layers of adhesives 7 to 9 are illustrated with openings 7a to 9a corresponding to the filter sections for allowing vibration at the locations of the openings 7a to 9a.

Adhesives 7 to 9, applied to one of each pair of substrate members to be joined to each other, may be applied to both substrate members to be joined to each other. Also, sheets of adhesive having openings 7a to 9a may be used as adhesives 7 to 9. Other suitable connecting material and devices may also be used.

Each of the external substrates 10 and 11 may be formed of a suitable insulating material, e.g., an insulating ceramic such as alumina, or a synthetic resin.

A chip type piezoelectric filter can be formed by superposing and bonding the members in the arrangement shown in FIG. 1.

Figure 4A:
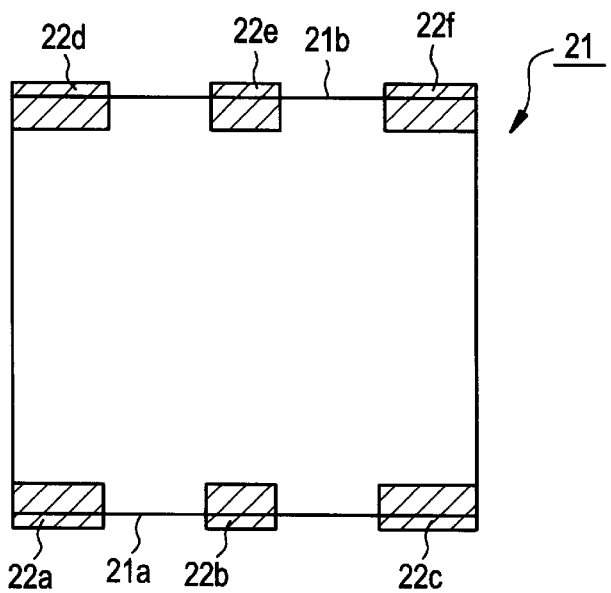
FIG. 4A is a plan view of a chip type piezoelectric filter according to another preferred embodiment of the present invention.
Figure 4B:
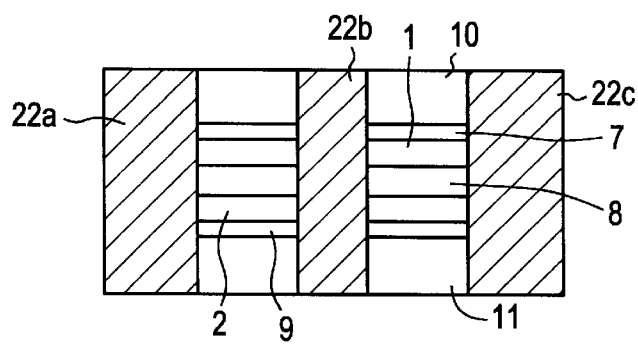
FIG. 4B is a side view of the chip type piezoelectric filter according to another preferred embodiment of the present invention shown in FIG. 4A.
Figure 4C:
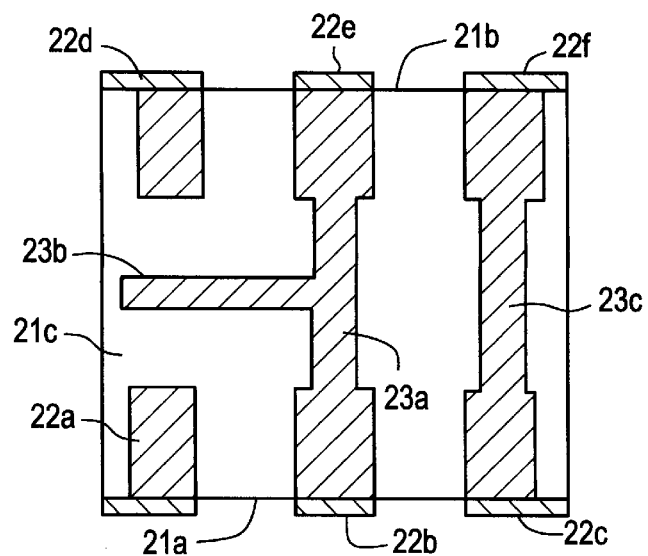
FIG. 4C is a bottom view of the chip type piezoelectric filter according to another preferred embodiment of the present invention shown in FIG. 4A.

A chip type piezoelectric filter 21, which represents a second preferred embodiment of the present invention, is obtained in this manner and has external electrodes located thereon as shown in FIGS. 4A through 4C.

That is, in the chip type piezoelectric filter 21, external electrodes 22a to 22f are disposed on side surfaces 21a and 21b. The external electrode 22a is connected to the lead-out electrode 5a on the second piezoelectric substrate 2 to be used as an output-side electrode. The external electrode 22a is arranged so as to extend from the side surface 21a to a lower surface 21c of the chip type piezoelectric filter 21.

The external electrode 22d is connected to the lead-out electrode 5a on the first piezoelectric substrate 1 to be used as an input-side electrode. The external electrode 22d extends from the side surface 21b to the lower surface 21c. The external electrode 22b located at the center of the side surface 21a of the chip type piezoelectric filter 21 is electrically connected to the electrode 6b on the first piezoelectric substrate and to the lead-out electrode 5c on the second piezoelectric substrate.

An external electrode 23a is disposed on the lower surface 21c of the chip type piezoelectric filter 21. The external electrode 23a electrically connects the external electrodes 22b and 22e and has an extensional electrode portion 23b.

The external electrode 22c is connected to the capacitive electrode 5b which functions as a lead-out electrode on the first piezoelectric substrate 1 and is also connected to a connective conductor element 23c on the lower surface 21c of the chip type piezoelectric filter 21. The external electrode 22e connects the electrode 6a on the first piezoelectric substrate 1 and the lead-out electrode 5d on the second piezoelectric substrate 2, and connects to the external electrode 23a on the lower surface 21c. The external electrode 22f is connected to the capacitive electrode 5b on the second piezoelectric substrate 2 and to the connective conductor element 23c on the lower surface 21c.

The extensional electrode portion 23b extends between the portions of the external electrodes 22a and 22d, which extend on the lower surface 21c of the chip type piezoelectric filter 21. That is, the degree of input-output separation is improved by disposing between the extensional electrode portion 23b between the input and output external electrodes 22d and 22a.

Figure 8:
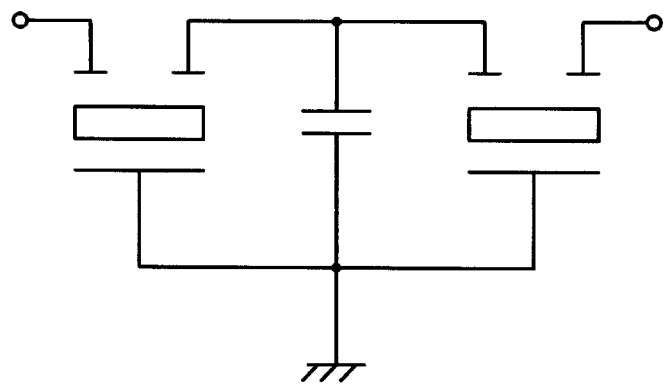
FIG. 8 is a circuit diagram of the piezoelectric filter shown in FIG. 7A and FIG. 7B.

The chip type piezoelectric filter 21 of this preferred embodiment is arranged as described above and has the same circuit configuration as the conventional dual-mode piezoelectric filter shown in FIG. 8 except that the two capacitors are provided on the piezoelectric substrate 1 and 2 for functioning as relay capacitors.

Figure 7A:
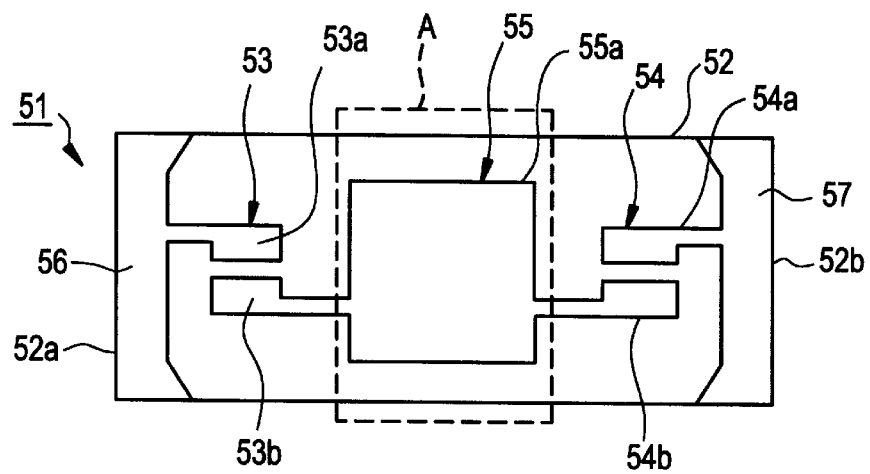
FIG. 7A is a plan view of a conventional piezoelectric filter.
Figure 7B:
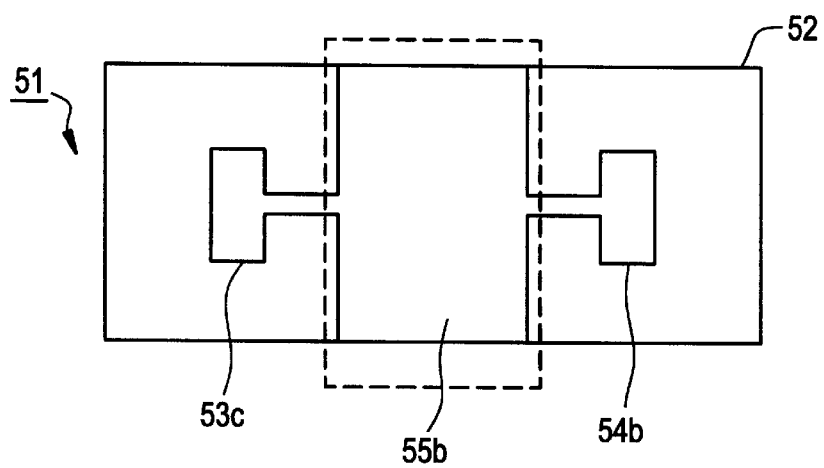
FIG. 7B is a bottom view of a conventional piezoelectric filter shown in FIG. 7A.

As described above, in the structure of the chip type piezoelectric filter 21 of this preferred embodiment, the first filter section and a capacitor are disposed on the first piezoelectric substrate 1 while the second filter section and a capacitor are disposed on the second piezoelectric substrate, and the first and second piezoelectric substrates are superposed on each other in the direction of thickness of the piezoelectric substrates. Therefore, the chip type piezoelectric filter 21 of this preferred embodiment can be mounted in a reduced mount space in comparison with the conventional piezoelectric filter 51 (see FIG. 7) in which a plurality of filter sections are laterally arranged.

Also, the capacitors arranged to function as relay capacitor components are separately disposed on the first and second piezoelectric substrates, and the area of each of the capacitive electrodes disposed on the piezoelectric substrates can be reduced. Also for this reason, the mount space can be reduced.

Moreover, since the regions of each of the piezoelectric substrates 1 and 2 on which the lead-out electrodes 5a and 5e and the capacitive electrodes 5b and 5f are located, and other adjacent regions are unpolarized, unnecessary vibrations caused by these electrodes can be suppressed, thus making it possible to improve filter characteristics. This effect will next be described with reference to FIGS. 5 and 6.

Figure 5:
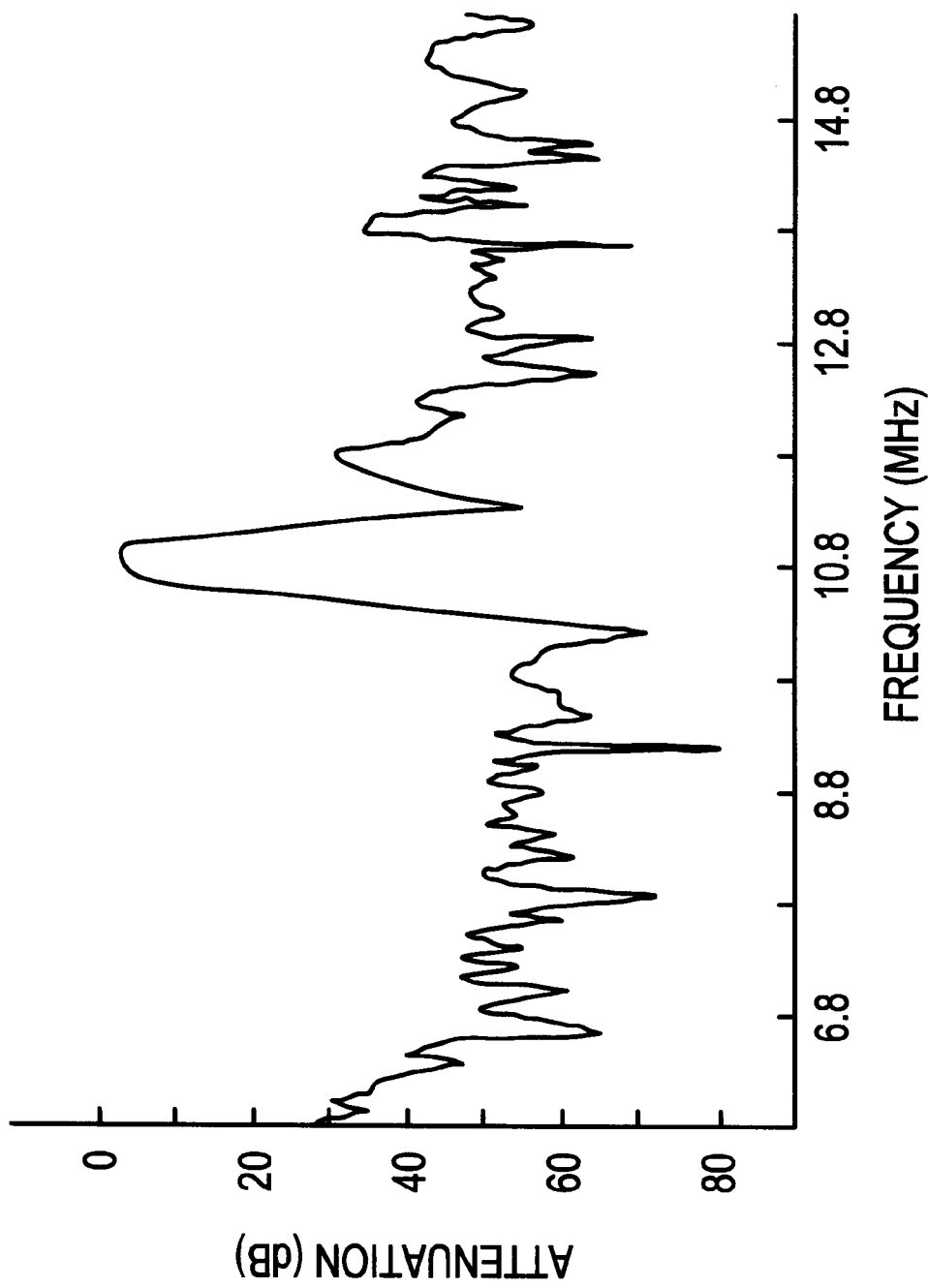
FIG. 5 is a graph showing a filter characteristic of a chip type piezoelectric filter in accordance with a preferred embodiment of the present invention.
Figure 6:
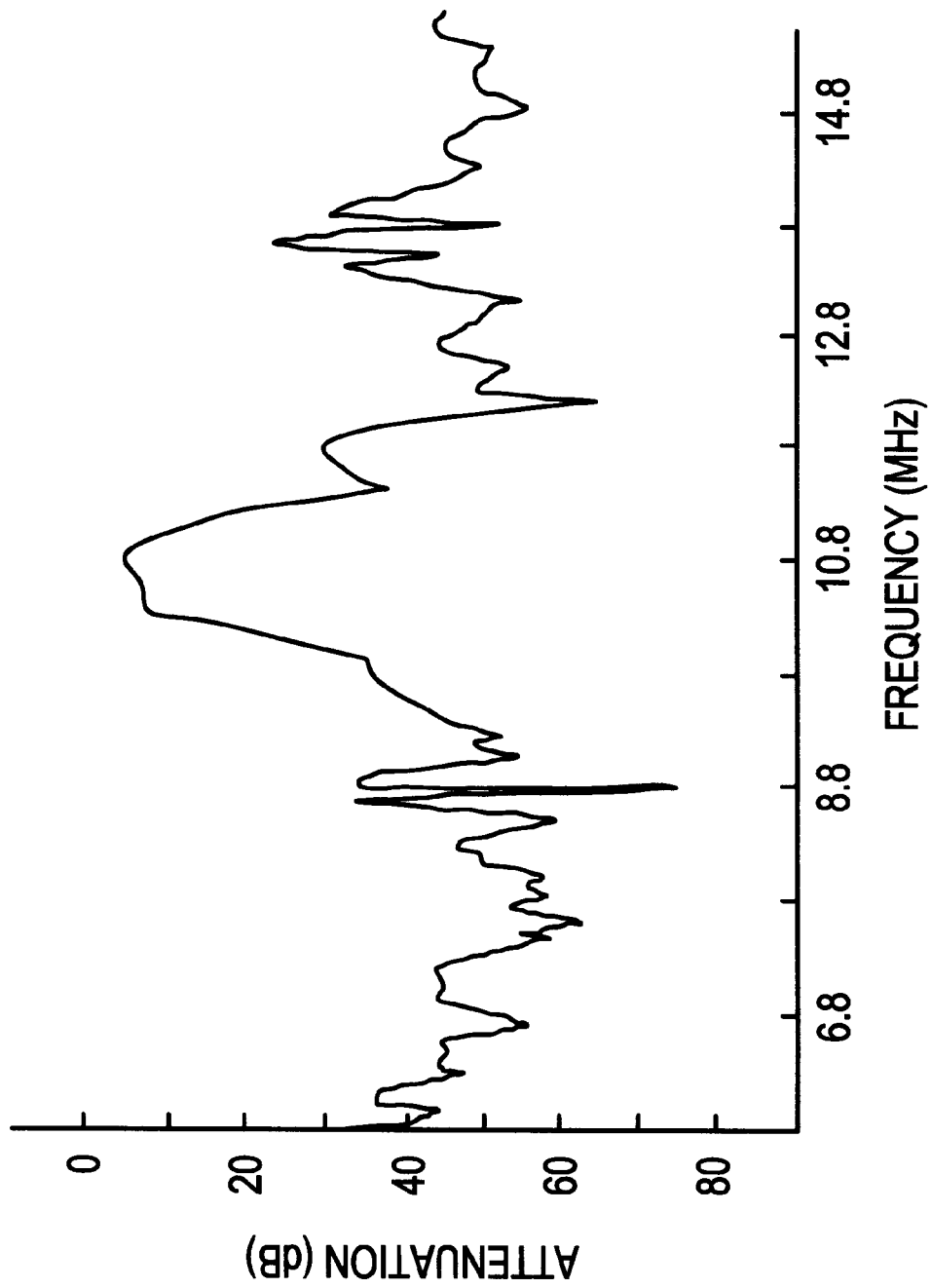
FIG. 6 is a graph showing a chip type piezoelectric filter which is similar to preferred embodiments of the present invention except that the entire piezoelectric substrate is polarized.

FIG. 5 is a diagram showing a characteristic of the piezoelectric filter of this preferred embodiment, and FIG. 6 shows a characteristic of a piezoelectric filter which is formed in the same manner as the above-described preferred embodiment except that no unpolarized region is provided in the piezoelectric substrates 1 and 2.

As is apparent from FIG. 6, the chip type piezoelectric filter in which the entire piezoelectric substrates 1 and 2 are polarized in the direction of thickness has such a characteristic that unnecessary vibrations are superposed in the pass band. In contrast, in the characteristic of the chip type piezoelectric filter of this preferred embodiment shown in FIG. 5, no unnecessary vibration is superposed in the pass band. It can therefore be understood that the piezoelectric filter of this preferred embodiment achieves a large amount of attenuation.

In the chip type piezoelectric filter of this preferred embodiment, the unpolarized regions of the piezoelectric substrate 1 indicated by broken lines B and C are located outside of the region extending parallel to the direction of connection between the resonant electrodes 3a and 3b. It is necessary that the portion of the piezoelectric 1 corresponding to the filter section 3 be polarized in the direction of thickness, and that other substrate portions in the region extending parallel to the direction of connection between the resonant electrodes 3a and 3b also be polarized to confine thickness-direction longitudinal vibration. On the other hand, it is not necessary for the piezoelectric substrate 1 to be polarized outside the region extending parallel to the direction of connection between the resonant electrodes 3a an 3b. Therefore, if unpolarized regions are defined outside of the region extending parallel to the direction of connection between the resonant electrodes 3a and 3b as in this preferred embodiment, unnecessary vibrations caused by the lead-out electrodes and capacitive electrodes can be effectively suppressed without hindering or suppressing vibration energy in the filter section 3.

According to the preferred embodiments of the present invention, however, unpolarized regions may be defined outside of the resonant electrodes 3a and 3b in the region extending parallel to the direction of connection between the pair of resonant electrodes. That is, if limitation of the size of the portion of the piezoelectric substrate 1 located outside the resonant electrodes 3a and 3b parallel to the direction of connection between the resonant electrodes 3a and 3b is not important, the size of the piezoelectric substrate 1 in this direction may be increased to suppress unnecessary vibrations caused by the lead-out electrodes and the capacitive electrodes while the portions of the piezoelectric substrate 1 corresponding to the lead-out electrodes and other adjacent portions are left unpolarized.

From the viewpoint of promoting the reduction in size, however, it is desirable that only the regions formed outside the region extending parallel to the direction of connection between the resonant electrodes 3a and 3b are left unpolarized, as in this preferred embodiment.

Also, in the piezoelectric filter of the preferred embodiments of the present invention, all the lead-out electrodes arranged so as to extend to the edges of each piezoelectric substrate may be disposed on unpolarized regions of the substrate. That is, all the piezoelectric substrate regions corresponding to the lead-out electrodes and regions in the vicinity of the same may be left unpolarized.

It is not always necessary for the capacitive electrodes 5b and 5f defining a capacitor to be located along edges of the piezoelectric substrate as shown in FIG. 2.

In the above-described first and second preferred embodiments, the first and second filter sections are connected to each other by capacitors. The chip type piezoelectric filter of the present invention, however, is not limited to the type having a plurality of filter sections; it may be a piezoelectric filter having only one filter section or a piezoelectric filter in which one or more piezoelectric filter sections other than the first and second filter sections are additionally connected through capacitors as desired.

While the invention has been particularly shown and described with reference to preferred embodiments thereof, it will be understood by those skilled in the art that the foregoing and other changes in form and details may be made therein without departing from the spirit of the invention.

What is claimed is:

1. An energy-trap type piezoelectric filter comprising:
   a piezoelectric substrate having first and second major surfaces;
   first and second resonant electrodes provided on said first major surface and being spaced from each other;
   a common electrode provided on said second major surface and located opposite to said first and second resonant electrodes;
   an excitation section including said first and second resonant electrodes, said common electrode, and a portion of said piezoelectric substrate located between said first and second resonant electrodes and said common electrode;
   a plurality of lead-out electrodes provided on said first and second major surfaces and connected to one of said first and second resonant electrodes and said common electrode, respectively; and
   first and second capacitive electrodes defining a capacitor and provided on said piezoelectric substrate and electrically connected to said excitation section; wherein
   said excitation section is located at a substantially central portion of said substrate, said first and second capacitive electrodes are located in a vicinity of a first edge of said piezoelectric substrate, said plurality of lead-out electrodes are located in the vicinity of a second edge of said piezoelectric substrate so as to extend to said second edge,
   the portion of said piezoelectric substrate constituting said excitation section is polarized, and another portion of said piezoelectric substrate where at least one of said plurality of lead-out electrodes and said first and second capacitive electrodes are located is unpolarized; wherein
   the polarzed portion extends substantially parallel to a direction of connection between the first and second resonant electrodes.

2. The piezoelectric filter according to claim 1, wherein said first and second capacitive electrodes are arranged to be opposed to each other with said piezoelectric substrate located therebetween.

3. An energy-trap type piezoelectric filter comprising:
   a piezoelectric substrate having first and second major surfaces;
   first and second resonant electrodes provided on said first major surface and being spaced from each other;
   a common electrode provided on said second major surface and located opposite to said first and second resonant electrodes;
   an excitation section including said first and second resonant electrodes, said common electrode, and a portion of said piezoelectric substrate located between said first and second resonant electrodes and said common electrode;
   a plurality of lead-out electrodes provided on said first and second major surfaces and connected to one of said first and second resonant electrodes and said common electrode, respectively; and
   first and second capacitive electrodes defining a capacitor and provided on said piezoelectric substrate and electrically connected to said excitation section; wherein
   the piezoelectric substrate is polarized only at a location of the excitation section and is not polarized at locations outside of said excitation section; wherein
   at least two of said piezoelectric substrates are stacked on top of each other such that said second major surface of a first one of said piezoelectric substrates faces said second major surface of a second one of said piezoelectric substrates.

4. An energy-trap piezoelectric filter comprising:
   a piezoelectric substrate having first and second major surfaces;
   first and second resonant electrodes provided on said first major surface and being spaced from each other;
   a common electrode provided on said second major surface and located opposite to said first and second resonant electrodes;
   an excitation section including said first and second resonant electrodes, said common electrode, and a portion of said piezoelectric substrate located between said first and second resonant electrodes and said common electrode;
   a plurality of lead-out electrodes provided on said first and second major surfaces and connected to one of said first and second resonant electrodes and said common electrode, respectively; and
   first and second capacitive electrodes defining a capacitor and provided on said piezoelectric substrate and electrically connected to said excitation section; wherein
   said excitation section is located at a substantially central portion of said substrate, said first and second capacitive electrodes are located in a vicinity of a first edge of said piezoelectric substrate, said plurality of lead-out electrodes are located in the vicinity of a second edge of said piezoelectric substrate so as to extend to said second edge;
   the portion of said piezoelectric substrate constituting said excitation section is polarized, and another portion of said piezoelectric substrate where at least one of said plurality of lead-out electrodes and said first and second capacitive electrodes are located is unpolarized; wherein at least two of said piezoelectric substrates are stacked on top of each other such that said second major surface of one of a first one of said piezoelectric substrates faces said second major surface of a second one of said piezoelectric substrates.

5. An energy-trap type piezoelectric filter according to claim 4, wherein said first and second capacitive electrodes are arranged to be opposed to each other so that said piezoelectric substrate is located therebetween.

6. An energy-trap type piezoelectric filter according to claim 4, further comprising an adhesive, wherein at least two of said piezoelectric substrates are stacked and bonded to each other by said adhesive, where said adhesive is not applied to portions of said piezoelectric substrates corresponding to a location of said excitation section.

7. An energy-trap type piezoelectric filter according to claim 4, further comprising an adhesive sheet, wherein at least two of said piezoelectric substrates are stacked and bonded to each other by said adhesive sheet, where said adhesive sheet has an opening corresponding to a location of said excitation section.

8. An energy-trap piezoelectric filter comprising:
   a piezoelectric substrate having first and second major surfaces;
   first and second resonant electrodes provided on said first major surface and being spaced from each other;
   a common electrode provided on said second major surface and located opposite to said first and second resonant electrodes;

an excitation section including said first and second resonant electrodes, said common electrode, and a portion of said piezoelectric substrate located between said first and second resonant electrodes and said common electrode;

a plurality of lead-out electrodes provided on said first and second major surfaces and connected to one of said first and second resonant electrodes and said common electrode, respectively; and first and second capacitive electrodes defining a capacitor and provided on said piezoelectric substrate and electrically connected to said excitation section; wherein an area of said piezoelectric substrate at which at least one of said plurality of lead out electrodes is located is unpolarized; wherein at least two of said piezoelectric substrates are stacked on top of each other such that said second major surface of a first one of said piezoelectric substrates faces said second major surface of a second one of said piezoelectric substrates.

9. The piezoelectric filter according to claim 8, wherein an area of said piezoelectric substrate at which each of said plurality of lead out electrodes is located is unpolarized.

10. The piezoelectric filter according to claim 8, wherein an area of said piezoelectric substrate at which at least one of said first and second capacitive electrodes is located is unpolarized.

11. The piezoelectric filter according to claim 8, wherein an area of said piezoelectric substrate at which each of said first and second capacitive electrodes is located is unpolarized.

12. The piezoelectric filter according to claim 8, wherein the portion of said piezoelectric substrate constituting said excitation section is polarized.

13. The piezoelectric filter according to claim 8, wherein said excitation section is located at a substantially central portion of said substrate, said first and second capacitive electrodes are located in a vicinity of a first edge of said piezoelectric substrate, said plurality of lead-out electrodes are located in the vicinity of a second edge of said piezoelectric substrate so as to extend to said second edge.

14. The piezoelectric filter according to claim 8, wherein the portion of the piezoelectric substrate which is unpolarized extends substantially parallel to a direction of connection between the first and second resonant electrodes.

15. The piezoelectric filter according to claim 8, wherein said first and second capacitive electrodes are arranged to be opposed to each other with said piezoelectric substrate located therebetween.

16. An energy-trap type piezoelectric filter according to claim 8, further comprising an adhesive sheet, wherein at least two of said piezoelectric substrates are stacked and bonded to each other by said adhesive sheet, where said adhesive sheet has an opening corresponding to a location of said excitation section.

17. An energy-trap type piezoelectric filter according to claim 8, further comprising an adhesive, wherein at least two of said piezoelectric substrates are stacked and bonded to each other by said adhesive, where said adhesive is not applied to portions of said piezoelectric substrates corresponding to a location of said excitation section.

* * * * *